United States Patent
Cha

(10) Patent No.: US 7,285,941 B2
(45) Date of Patent: Oct. 23, 2007

(54) DC-DC CONVERTER WITH LOAD INTENSITY CONTROL METHOD

(75) Inventor: Jae-deok Cha, Seoul-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 320 days.

(21) Appl. No.: 10/978,388

(22) Filed: Nov. 2, 2004

(65) Prior Publication Data

US 2005/0212497 A1 Sep. 29, 2005

(30) Foreign Application Priority Data

Mar. 26, 2004 (KR) ............... 10-2004-0020845

(51) Int. Cl.
*G05F 1/59* (2006.01)

(52) U.S. Cl. ............... 323/272; 323/284; 323/285

(58) Field of Classification Search ........... 323/272, 323/282, 283, 284, 285
See application file for complete search history.

(56) References Cited

U.S. PATENT DOCUMENTS

| | | | |
|---|---|---|---|
| 6,034,514 A | 3/2000 | Sakai | 323/225 |
| 6,043,634 A * | 3/2000 | Nguyen et al. | 323/272 |
| 6,404,173 B1 * | 6/2002 | Telefus | 323/272 |
| 6,545,450 B1 * | 4/2003 | Ledenev et al. | 323/272 |
| 6,621,255 B2 * | 9/2003 | Telefus | 323/272 |
| 6,654,264 B2 * | 11/2003 | Rose | 363/65 |
| 7,071,660 B2 * | 7/2006 | Xu et al. | 323/266 |
| 7,078,884 B2 * | 7/2006 | Miura et al. | 323/272 |
| 7,122,995 B2 * | 10/2006 | Hasegawa et al. | 323/272 |

FOREIGN PATENT DOCUMENTS

| | | |
|---|---|---|
| JP | 5-191969 | 7/1993 |
| JP | 8-275508 | 10/1996 |
| JP | 2004-72964 | 3/2004 |
| KR | 10-328176 | 10/2002 |

OTHER PUBLICATIONS

Notice of Official Action issued by the Korean Intellectual Property Office on Jan. 31, 2006 in the corresponding Korean Patent Application No. 10-2004-0020845 (2 pages) (1 page English translation).
The First Office Action issued by The State Intellectual Property Office of P.R. China on Jun. 8, 2007 in the corresponding Chinese Application No. 200510053979X (2 pages) (English translation consisting of 3 pages).
Text of the First Office Action issued in Chinese Patent Application No. 200510053979.X (6 pages) (English translation consisting of 8 pages).

* cited by examiner

*Primary Examiner*—Jeffrey Sterrett
(74) *Attorney, Agent, or Firm*—Staas & Halsey LLP

(57) ABSTRACT

A DC-DC converter to convert DC power input from an external source into a predetermined DC power required for an electric load. A switch part in which each of a pair of switches that cuts or supplies the input DC power is connected in parallel with at least one other switch. A current sensor senses a load current flowing through the electric load and a controller controls the switch part to enable a number of the switches according to an intensity of the load current sensed by the current sensor. The enabled switches are driven by a PWM signal to cut or supply the input DC power to the load. By changing the number of enabled switches, unnecessary switching is prevented for lower load currents.

7 Claims, 4 Drawing Sheets

DC-DC CONVERTER WITH LOAD INTENSITY CONTROL METHOD

CROSS-REFERENCE TO RELATED APPLICATIONS

This application claims the benefit of Korean Patent Application No. 2004-20845, filed Mar. 26, 2004 in the Korean Intellectual Property Office, the disclosure of which is incorporated herein by reference.

BACKGROUND OF THE INVENTION

1. Field of the Invention

The present invention relates to a DC-DC converter and a control method thereof, and more particularly, to a DC-DC converter minimizes an unnecessary switching occurring when a light electric load is connected and which improves an efficiency of the DC-DC converter and a control method thereof.

2. Description of the Related Art

Generally, a DC-DC converter converts a DC power input from an external source to a predetermined DC power that an electric load requires. DC-DC converters may be classified into a boost type to raise a voltage of the input DC power and a buck type to drop the voltage of the input DC power.

Hereinbelow, a synchronous buck converter is taken as an example for a description.

As shown in FIG. 1, the synchronous buck converter comprises a pair of switches 300 and 302 which are alternately operable according to a pulse width modulation (PWM) signal output from a controller (not shown) and which supply/cut an input DC power $V_{IN}$, an inductor 316 connected to a common node between the pair of switches 300 and 302 and a capacitor 318 connected between the inductor 316 and a ground potential.

According to the configuration described above, a description of an operation of the synchronous buck converter follows.

The synchronous buck converter is operated in two modes according to whether each of the switches 300 and 302 is turned on or off.

In a first mode, the switch 300 is turned on and the switch 302 is turned off. In the first mode, the DC power $V_{IN}$ is supplied to an input end of the inductor 316, so that an electric current flowing through the inductor 316 increases. Thus, energy is accumulated in the inductor 316 and the energy is supplied to an output end of the inductor 316, so that an output voltage $V_{OUT}$ across a capacitor 318 rises.

In a second mode, the switch 300 is turned off and the switch 302 is turned on, so that the inductor 316 and the capacitor 318 form a closed circuit. In the second mode, an electric current flowing through the inductor 316 flows continually through the closed circuit until the switch 300 is turned on in a next period of the PWM signal. Thus, an electric charge on the capacitor 318 decreases and the output voltage $V_{OUT}$ drops.

The controller (not shown) senses the output voltage $V_{OUT}$ output to the electric load 320. If the output voltage $V_{OUT}$ is low, the controller lengthens the turned-on time of the switch 300 and shortens the turned-on time of the switch 302 to raise the output voltage $V_{OUT}$. If the output voltage $V_{OUT}$ is high, the controller shortens the turned-on time of the switch 300 and lengthens the turned-on time of the switch 302 to reduce the output voltage $V_{OUT}$. That is, the controller adjusts a duty ratio of the PWM signal output to each of the switches 300 and 302 according to the output voltage $V_{OUT}$ to hold the voltage $V_{OUT}$ supplied to the electric load 320 at a constant value.

A delay circuit (not shown) which is operative after the inverter 314 provides a dead time between the switch 300 and the switch 302 to prevent a so-called arm short phenomenon in which an electric current is conducted from the input $V_{IN}$ directly to the ground potential as the switch 300 and the switch 302 are simultaneously turned on.

A central processing unit (CPU) of a mobile electronic device requires a relatively large current, thus in a CPU-voltage regulation module (CPU-VRM) a plurality of switches are connected in parallel to each of the switch 300 and the switch 302 shown in FIG. 1, to increase the current capacity.

As shown in FIG. 2, in a conventional CPU-VRM having the plurality of parallel switches, switches 341, 344 and 347 of a switch unit 340 are simultaneously turned on/off by a PWM signal output from a controller (not shown). Switches 351, 354 and 357 of a switch unit 350 are turned on/off alternately with the switches 341, 344 and 347. A dead time due to a delay circuit (not shown) after the inverter 360 is operative between the switch units 340 and 350 in a similar manner as described above with respect to the conventional circuit shown in FIG. 1.

However, in the conventional circuits described above, some of the switches connected in parallel are unnecessarily switched although a light electric load is connected, thereby causing a switching loss and decreasing the efficiency.

SUMMARY OF THE INVENTION

Accordingly, it is an aspect of the present invention to provide a DC-DC converter to minimize an unnecessary switching which occurs when a light electric load is connected to improve an efficiency of the DC-DC converter.

It is another aspect of the present invention to provide a method of controlling a DC-DC converter to minimize unnecessary switching, thereby improving the efficiency of the DC-DC converter.

The foregoing and/or other aspects of the present invention are achieved by providing a DC-DC converter to convert a DC power input from an external source into a predetermined DC power required for an electric load and to supply the converted DC power to an electric load, the DC-DC converter comprising: a switch part in which each of a pair of switches connected in series is connected with at least one switch in parallel and that cuts or supplies the input DC power; a current sensor to sense a load current flowing through the electric load; and a controller to control the switch part to change a number of the switches to be enabled, according to an intensity of the load current sensed by the current sensor.

According to an aspect of the invention, the controller generates a PWM signal to drive the switches and selectively supplies the PWM signal to the switches to change the number of the switches to be enabled according to the intensity of the load current.

According to an aspect of the invention the controller comprises: a PWM controller to generate the PWM signal and enable/disable signals to enable/disable the switches according to the PWM signal and the intensity of the load current; a PWM signal line to transfer the PWM signal generated from the PWM controller to a predetermined number of switches; and at least one logic operator to logically operate the PWM signal and the enable/disable signals generated from the PWM controller and to output the operated result to the switches.

According to an aspect of the invention, the controller reduces the number of the switches to be enabled as the intensity of the load current is weaker and increases the number of the switches to be enabled as the intensity of the load current is stronger.

The foregoing and/or other aspects of the present invention are also achieved by providing a control method of a DC-DC converter to convert a DC power input from an external source into a predetermined DC power required for an electric load and supply the converted DC power to the electric load, the control method comprising: providing a switch part in which each of a pair of switches connected in series is connected with at least one switch in parallel and that cuts or supplies input DC power; sensing a load current flowing through the electric load; and controlling the switch part to change a number of switches to be enabled according to an intensity of the sensed load current.

According to an aspect of the invention, the controlling of the switch part comprises: generating a PWM signal to drive the switches; and selectively supplying the PWM signal to the switches according to the intensity of the load current.

According to an aspect of the invention, the controlling the switch part comprises reducing the number of the switches to be enabled as the intensity of the load current is weaker and increasing the number of the switches to be enabled as the intensity of the load current is stronger.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
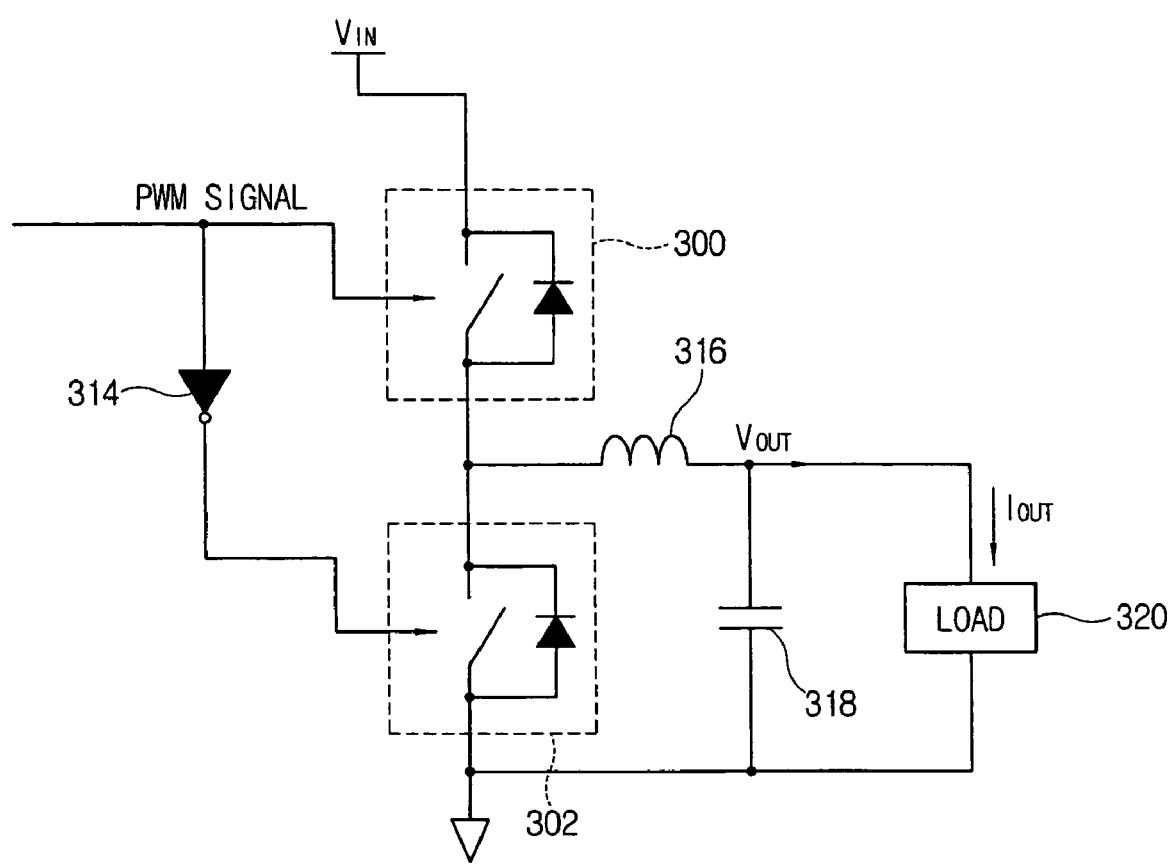
FIG. 1 is a circuit diagram of a conventional DC-DC converter.
Figure 2:
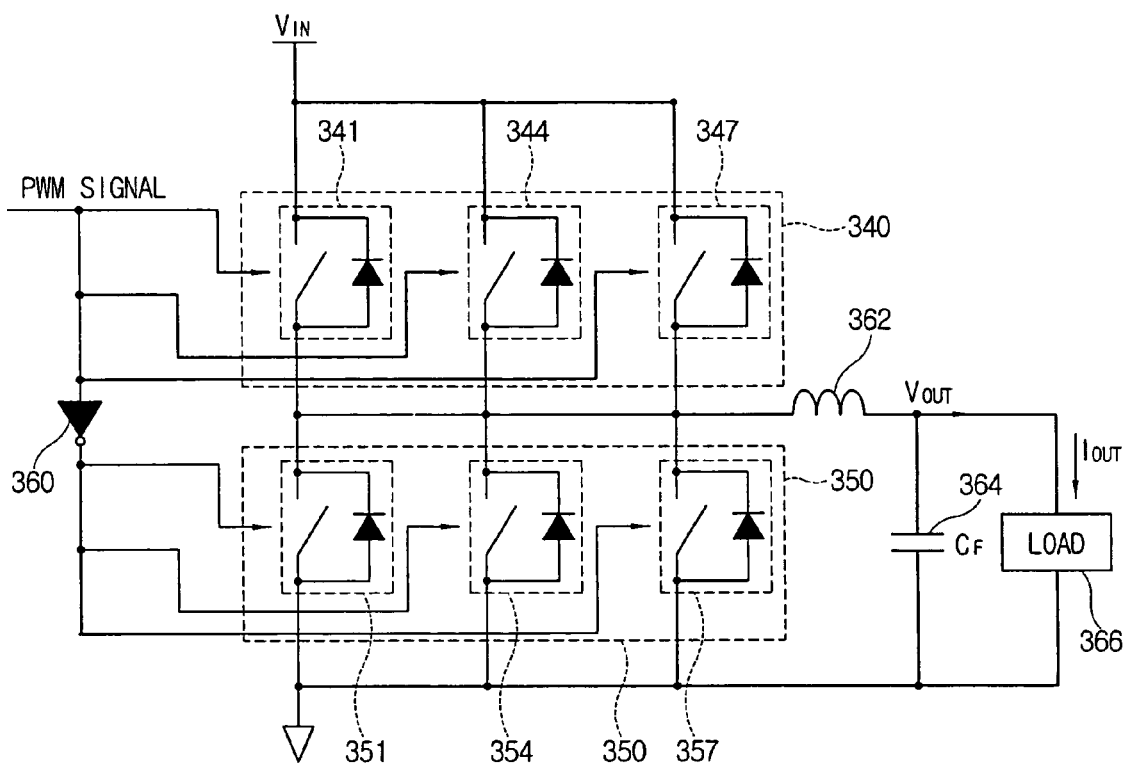
FIG. 2 is a circuit diagram of a conventional DC-DC converter adapted to supply a large current.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 3:
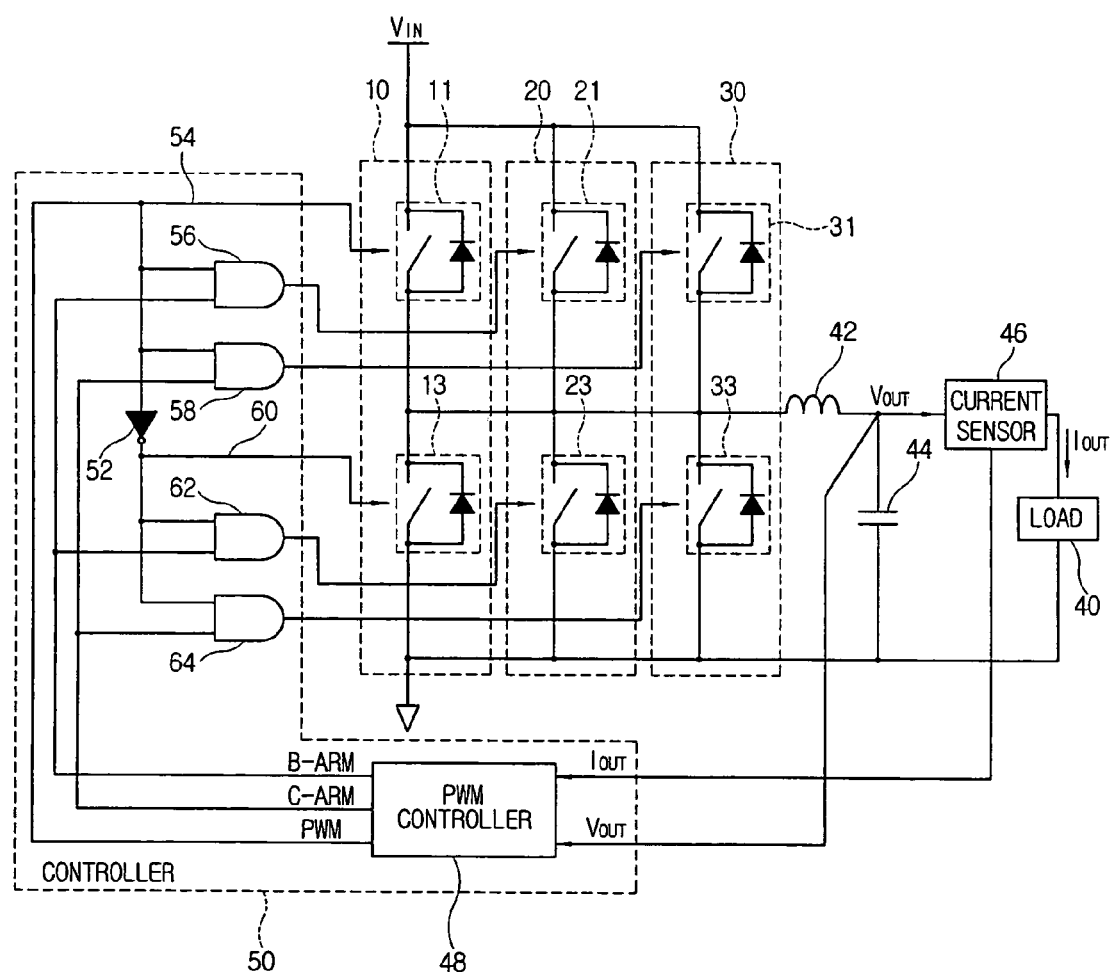
FIG. 3 is a circuit diagram of a DC-DC converter according to an embodiment of the present invention.

Referring to FIG. 3, a DC-DC converter according to an embodiment of the present invention comprises a switch part comprising a plurality of switch blocks 10, 20 and 30 (hereinbelow, referred to as "switch arms 10, 20 and 30") connected in parallel, each switch arm comprising a pair of switches each operated to alternately cut or supply input DC power $V_{IN}$; an inductor 42 and a capacitor 44 to smooth electric power output by turning on/off of the switch part and supply the smoothen electric power to an electric load 40; a current sensor 46 to sense a load current $I_{OUT}$ flowing through the electric load 40; and a controller 50 to control the switch part to change the number of switch arms 10, 20, and 30 to be enabled, according to an intensity of the load current $I_{OUT}$ sensed by the current sensor 46.

The switch part comprises the plurality of the switch arms 10, 20, and 30 connected in parallel, each switch arm comprising a pair of switches 11, 13; 21, 23; and 31, 33, respectively, connected in series between the input DC power $V_{IN}$ and the ground potential. The switches 11, 21 and 31 and switches 13, 23 and 33 of each of the switch arms 10, 20 and 30 are turned on/off according to a control of the controller 50. Here, a Metal-Oxide Semiconductor Field-Effect Transistor (MOSFET) is useable as the switches 11, 13, 21, 23, 31 and 33.

A low pass filter comprising the inductor 42 and the capacitor 44 is connected at a common node between the switches 11, 21 and 31 and the switches 13, 23 and 33.

The current sensor 46 senses the load current $I_{OUT}$ flowing through the electric load 40 and a variety of conventional techniques may be applied to the current sensor 46. For example, a current mirror may be used as the electric current sensor 46 or the current may be sensed by sensing a voltage drop across a predetermined resistance caused by the load current $I_{OUT}$.

The controller 50 generates a pulse width modulation (PWM) signal by adjusting a duty ratio according to an output voltage $V_{OUT}$. The controller 50 comprises a PWM controller 48 to generate a B-ARM signal and/or a C-ARM signal to selectively enable/disable the switch arms 10, 20 and 30 according to the intensity of the load current $I_{OUT}$ sensed by the current sensor 46, PWM signal lines 54 and 60 to transmit the PWM signal generated by the PWM controller 48 to one of the switch arms 10, 20 and 30 and to a plurality of AND-gates 56, 58, 62 and 64 which AND-operate the PWM signal from the PWM controller 48 and the B-ARM and C-ARM signals to output a result of the operation to the switch arms 20 and 30, respectively.

If the B-ARM signal input to the AND-gates 56 and 62 is a high signal, the PWM signal is output to the switch arm 20 and the switch arm 20 is enabled. If the C-ARM signal input to the AND-gates 58 and 64 is a high signal, the PWM signal is output to the switch arm 30 and the switch arm 30 is enabled. If the B-ARM signal and the C-ARM signal are both high signals, both the switch arms 20 and 30 are enabled.

The PWM signal is delayed by a delay circuit (not shown) after an inverter 52 and output to the switches 13, 23 and 33 in a similar manner as the conventional DC-DC converter.

If the intensity of the load current $I_{OUT}$ is equal to or lower than a first predetermined level, the PWM controller 48 outputs B-ARM=0 and C-ARM=0. If the intensity of the load current $I_{OUT}$ is higher than the first predetermined level and equal to and lower than a second predetermined level, the PWM controller outputs B-ARM=1 and C-ARM=0. If the intensity of the load current $I_{OUT}$ is higher than the second predetermined level, the PWM controller outputs B-ARM=1 and C-ARM=1. Here, "0" is a low signal or a disable signal and "1" is a high signal or an enable signal.

If the PWM controller 48 outputs B-ARM=0 and C-ARM=0, the switches 11 and 13 of the switch arm 10 are enabled and the PWM signal is continually input to the switches 11 and 13 through the PWM signal lines 54 and 60. However, the switches 21, 23, 31 and 33 of the switch arms 20 and 30 are disabled.

If the PWM controller 48 outputs B-ARM=1 and C-ARM=0, the switches 11 and 13 of the switch arm 10 are enabled and the switches 21 and 23 of the switch arm 20 are enabled by the B-ARM high signal applied to the AND-gates 56 and 62 to receive the PWM signal.

If the PWM controller 48 outputs B-ARM=1 and C-ARM=1, all of the switches 11, 13, 21, 23, 31 and 33 of all of the switch arms 10, 20 and 30 are enabled to receive the PWM-signal. The switches 31 and 33 are enabled by the C-ARM high signal applied to the AND-gates 58 and 64.

The controller 50 controls the levels of the B-ARM signal and the C-ARM signal according to the intensity of the load current $I_{OUT}$ sensed by the current sensor 46, so that the number of the enabled switch arms 10, 20 and 30 becomes smaller as the intensity of the load current $I_{OUT}$ is weaker and larger as the intensity of the load current becomes stronger.

The controller 50 senses the output voltage $V_{OUT}$ and controls the duty ratio of the PWM signal to make the output voltage $V_{OUT}$ constant.

Figure 4:
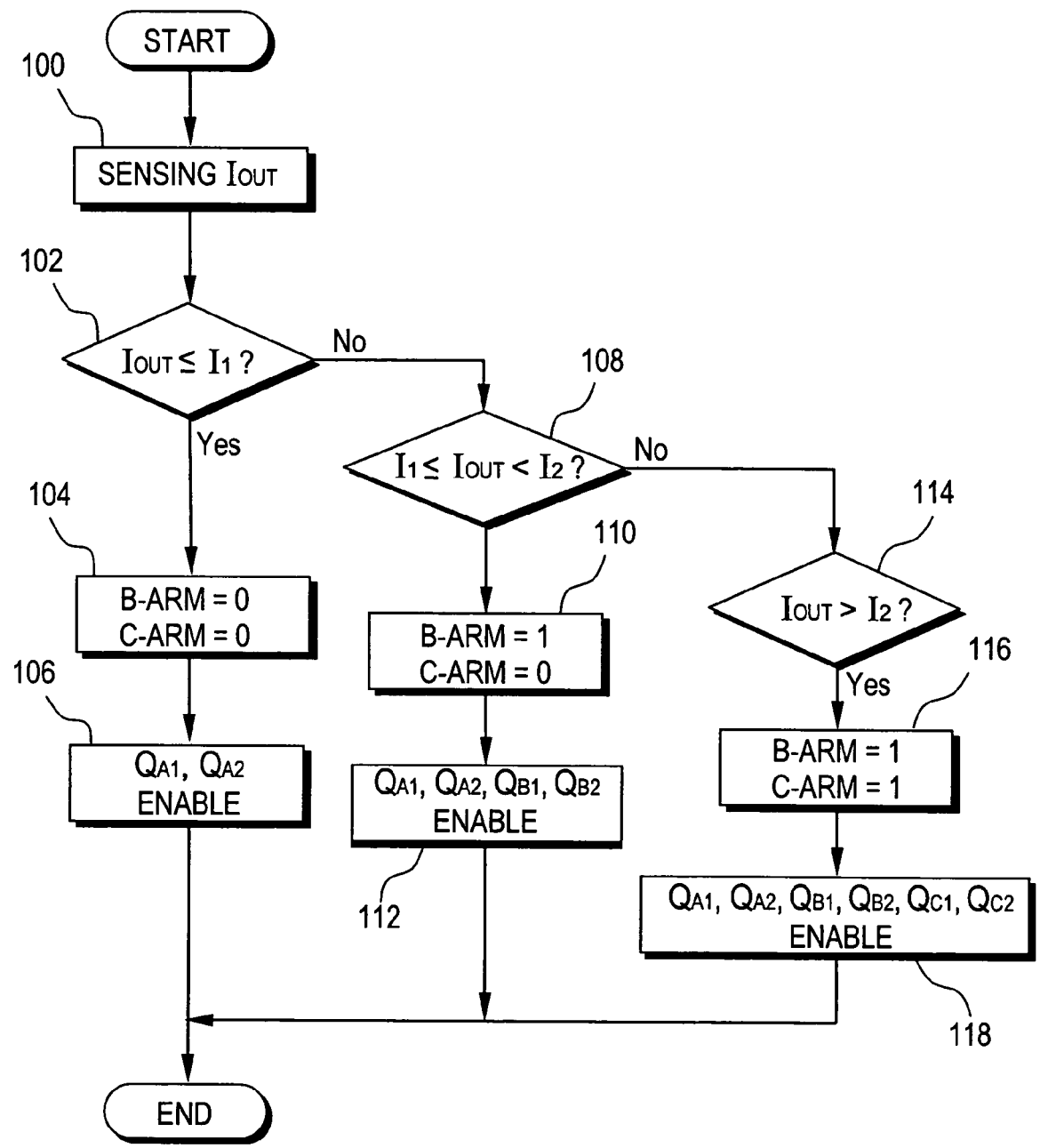
FIG. 4 is a control flow chart of the DC-DC converter according to the embodiment of the present invention.

According to the configuration described above, a description of a flow control of the DC-DC converter according to the embodiment of the present invention is described referring to FIG. 4. In the description below, I1 and I2 represent the first and second predetermined levels, respectively, described above and it is assumed that I1<I2.

The current sensor 46 senses the load current $I_{OUT}$ flowing through the electric load 40 at operation 100. The PWM controller 48 determines whether the load current $I_{OUT}$ sensed by the current sensor 46 is equal to or lower than I1 at operation 102.

If the load current $I_{OUT}$ is equal to or lower than I1, the PWM controller 48 outputs low signals as the B-ARM signal and the C-ARM signal at operation 104, i.e., the PWM controller outputs B-ARM=0 and C-ARM=0. The PWM signal is supplied to the switches 11 and 13 of the switch arm 10 through the PWM signal lines 54 and 60 and each of the AND-gates 56, 58, 62 and 64 outputs low signals by an AND operation of the PWM signal with the B-ARM signal and the C-ARM signal, so that the switches 21, 23, 31 and 33 of the switch arms 20 and 30 are disabled. That is, only the switches 11 and 13 of the switch arm 10 are enabled at operation 106. In FIG. 4, switches 11, 13, 21, 23, 31 and 33 are represented by symbols $Q_{A1}$, $Q_{A2}$, $Q_{B1}$, $Q_{B2}$, $Q_{C1}$, and $Q_{C2}$, respectively.

If the load current $I_{OUT}$ is higher than I1 and equal to or lower than I2 at operation 108, the PWM controller 48 outputs a high signal as the B-ARM signal (B-ARM=1) and a low signal as the C-ARM signal (C-ARM=0) at operation 110. Thus, the PWM signal is output by the AND-gates 56 and 62 to which the B-ARM high signal is input. Thus, the switches 11, 13, 21 and 23 of the switch arms 10 and 20 are enabled at operation 112.

If the load current $I_{OUT}$ is higher than I2 at operation 114, the PWM controller 48 outputs high signals as the B-ARM signal and the C-ARM signal at operation 116. Thus, all of the switches 11, 13, 21, 23, 31 and 33 are enabled at operation 118.

That is, the controller 50 makes the number of switch arms 10, 20 and 30 to be enabled smaller as the intensity of the load current $I_{OUT}$ is weaker, thereby minimizing unnecessary switching if a light electric load is connected and makes the number of switch arms 10, 20 and 30 to be enabled larger as the intensity of the load current $I_{OUT}$ is stronger, thereby distributing a stress on the switches across a greater number of the switches.

In the embodiment described above, the controller 50 comprises the PWM controller 48, the PWM signal lines 54 and 60, and the AND-gates 56, 58, 62 and 64, but is not limited thereto. A variety of controllers may be employed as long as the controller controls the number of switches 11, 13, 21, 23, 31 and 33 to be enabled according to the intensity of the load current $I_{OUT}$ sensed by the current sensor 46.

Further, in the embodiment described above, an even number of the switches are enabled by enabling the switch arms 10, 20 and 30 according to the intensity of the load current $I_{OUT}$. Alternatively, the number of the switches to be enabled according to the intensity of the load current $I_{OUT}$ may be varied within the number of the switches.

In the embodiment described above, the switches 11, 13, 21, 23, 31 and 33 may be, for example, N-channel MOS-FETs. Alternatively, the switches 11, 21 and 31 may be P-channel MOSFETs. Where P-channel MOSFETS are used, the inverter 52 is not required.

In the embodiment described above, control of the load current $I_{OUT}$ is accomplished according to the number of the switches.

In the embodiment described above, a synchronous converter is employed. However, other converters, like a boost converter, may be used for the present invention.

In summary, the present invention controls the number of the switches to be enabled according to the intensity of the load current $I_{OUT}$, thereby decreasing unnecessary switching occurred when the light electric load is connected and increasing the efficiency of the converter.

As described above, the present invention provides a DC-DC converter in which unnecessary switching is minimized and the efficiency of the DC-DC converter is increased and a method of controlling the DC-DC converter.

Although a few embodiments of the present invention have been shown and described, it will be appreciated by those skilled in the art that changes may be made in these embodiments without departing from the principles and spirit of the invention, the scope of which is defined in the accompanying claims and their equivalents.

What is claimed is:

1. A DC-DC converter to convert a DC power input from an external source into a predetermined DC power required for an electric load and supply the converted DC power to the electric load, the DC-DC converter comprising:

a switch part in which each of a pair of switches connected in series is connected with at least one switch in parallel and that cuts or supplies the input DC power to the electric load;

a current sensor to sense a load current flowing through the electric load; and a controller to control the switch part changing a number of the switches to be enabled to cut or supply the DC power to the electric load, according to an intensity of the load current sensed by the current sensor, wherein the controller generates a PWM signal to drive the switches and selectively supplies the PWM signal to the switches to change the number of the switches to be enabled according to the intensity of the load current, and the controller comprises:

a PWM controller to generate the PWM signal and enable/disable signals to enable/disable the switches according the intensity of the load current;

a PWM signal line to transfer the PWM signal generated from the PWM controller to a first predetermined number of switches; and at least one logic operator to logically operate the PWM signal and the enable/disable signals generated by the PWM controller and to output the operated result to a second predetermined number of the switches.

2. The DC-DC converter according to claim 1, wherein the controller reduces the number of the switches to be enabled as the intensity of the load current is weaker and increases the number of the switches to be enabled as the intensity of the load current is stronger.

3. A method of controlling a DC-DC converter to convert a DC power input from an external source into a predetermined DC power required for an electric load and supply the converted DC power to the electric load, the method comprising:
   providing a switch part in which each of a pair of switches connected in series is connected with at least one switch in parallel and that cuts or supplies input DC power;
   sensing a load current flowing through the electric load; and
   controlling the switch part to change a number of the switches to be enabled according to an intensity of the sensed load current,
   wherein the controlling of the switch part comprises:
      generating a PWM signal to drive the switches; and
      selectively supplying the PWM signal through a plurality of AND-gates to the switches according to the intensity of the load current.

4. The method according to claim 3, wherein the controlling of the switch part comprises:
   reducing the number of the switches to be enabled as the intensity of the load current is weaker, and
   increasing the number of the switches to be enabled as the intensity of the load current is stronger.

5. A DC-DC converter for supplying power to an electric load, comprising:
   an inductor having an input end and an output end to connect to the electric load;
   a first plurality of switches which selectively connect the input end of the inductor with a first potential of a source of DC power;
   a second plurality of switches which selectively connect the input end of the inductor with a second potential of the source of the DC power;
   a current sensor which senses a current flowing through the electric load;
   a capacitance connected between the output end of the inductor and the second potential; and
   a controller which drives a first number of the first plurality of switches and a second number of the second plurality of switches with a PWM signal according to a value of the sensed load current,
   wherein:
      the controller generates an enable signal where the sensed load current is greater than a predetermined value; and
      the controller further comprises a plurality of AND gates, one of which ANDs the enable signal with the PWM signal to drive one of the first plurality of switches and another of which ANDs the enable signal with the PWM signal to drive one of the second plurality of switches.

6. The DC-DC converter according to claim 5, wherein:
   the controller generates a second enable signal where the sensed load current is greater than a second predetermined value; and
   the controller further comprises a second plurality of AND gates, one of which ANDs the second enable signal with the PWM signal to drive another one of the first plurality of switches and another of which ANDs the enable signal with the PWM signal to drive another one of the second plurality of switches.

7. The DC-DC converter according to claim 5, further comprising:
   an inverter which inverts the PWM signal so that the driven ones of the first plurality of switches are driven out of phase with the driven ones of the second plurality of switches.

* * * * *

UNITED STATES PATENT AND TRADEMARK OFFICE
CERTIFICATE OF CORRECTION

PATENT NO. : 7,285,941 B2  
APPLICATION NO. : 10/978388  
DATED : October 23, 2007  
INVENTOR(S) : Jae-deok Cha Page 1 of 1

It is certified that error appears in the above-identified patent and that said Letters Patent is hereby corrected as shown below:

Page 1, under Column 1-2 (U.S. PATENT DOCUMENTS), insert
--5,973,367   10/1999   Williams    257/365  
6,341,078    1/2002    Miller      363/98  
2001/14950   8/2001    Nishikawa   713/300  
6,087,740    7/2000    Williams    307/125--.

Signed and Sealed this

Tenth Day of June, 2008

JON W. DUDAS  
*Director of the United States Patent and Trademark Office*